United States Patent
Breit et al.

(10) Patent No.: US 7,416,789 B2
(45) Date of Patent: Aug. 26, 2008

(54) REFRACTORY METAL SUBSTRATE WITH IMPROVED THERMAL CONDUCTIVITY

(75) Inventors: Henry F. Breit, Attleboro, MA (US); Rong-Chein Richard Wu, Chelmsford, MA (US); Prabhat Kumar, Framingham, MA (US)

(73) Assignee: H.C. Starck Inc. (DE)

( * ) Notice: Subject to any disclaimer, the term of this patent is extended or adjusted under 35 U.S.C. 154(b) by 0 days.

(21) Appl. No.: 10/978,940

(22) Filed: Nov. 1, 2004

(65) Prior Publication Data
US 2006/0091552 A1    May 4, 2006

(51) Int. Cl.
*B32B 3/20*    (2006.01)
*B32B 3/24*    (2006.01)
*B32B 3/30*    (2006.01)
*B32B 15/01*    (2006.01)
*B32B 15/04*    (2006.01)
*B32B 15/20*    (2006.01)
*H01L 23/36*   (2006.01)

(52) U.S. Cl. .............. 428/614; 428/596; 428/620; 428/621; 428/660; 428/668; 428/674; 428/457; 361/709; 257/720

(58) Field of Classification Search .............. None
See application file for complete search history.

(56) References Cited

U.S. PATENT DOCUMENTS

| | | | |
|---|---|---|---|
| 4,996,115 A | 2/1991 | Eerkes et al. | 428/614 |
| 5,011,655 A | 4/1991 | Mankins | 419/8 |
| 5,156,923 A | 10/1992 | Jha et al. | 428/614 |
| 5,300,809 A | 4/1994 | Nakamura et al. | 257/684 |
| 6,045,927 A | 4/2000 | Nakanishi et al. | 428/614 |
| 6,555,762 B2 | 4/2003 | Appelt et al. | 174/264 |
| 2002/0043364 A1 | 4/2002 | Suzuki et al. | 165/185 |

FOREIGN PATENT DOCUMENTS

EP       0 537 965 A2    4/1993

(Continued)

OTHER PUBLICATIONS

Tokunaga (JP 09-045828 English Machine Translation) Feb. 1997.*

(Continued)

*Primary Examiner*—Keith D. Hendricks
*Assistant Examiner*—Jason L Savage
(74) *Attorney, Agent, or Firm*—Connolly Bove Lodge & Hutz, LLP

(57) ABSTRACT

A substrate for semiconductor and integrated circuit components including:
  a core plate containing a Group VIB metal from the periodic table of the elements and/or an anisotropic material, having a first major surface and a second major surface and a plurality of openings extending, at least partially, from the first major surface to the second major surface; and
  a Group IB metal from the periodic table of the elements or other high thermally conductive material filling at least a portion of the space encompassed by at least some of the openings; and
  optionally, a layer containing a Group IB metal from the periodic table or other high thermally conductive material disposed over at least a portion of the first major surface and at least a portion of the second major surface.

The substrate can be used in electronic devices, which can also include one or more semiconductor components.

33 Claims, 3 Drawing Sheets

FOREIGN PATENT DOCUMENTS

WO         01/78109 A2    10/2001

OTHER PUBLICATIONS

Patent Abstracts of Japan vol. 1999, No. 07, Mar. 31, 1999 & JP 03 231445 A Inco Ltd), Oct. 15, 1991 abstract.

Patent Abstracts of Japan vol. 1997, No. 06, Jun. 30, 1997 & JP 09 045828 A Nec Corp), Feb. 14, 1997 abstract; figure 2.

Advanced Engineering Materials, 6, No. 3, (month unavailable) 2004, pp. 142-144, Arndt. Luedtke, "Thermal Management Materials for High-Performance Applications".

* cited by examiner

REFRACTORY METAL SUBSTRATE WITH IMPROVED THERMAL CONDUCTIVITY

BACKGROUND OF THE INVENTION

1. Field of the Invention

The present invention is generally related to direct mount heat sinks for heat generating devices used in electronic applications and in particular to heat sinks containing Group VIB metals from the periodic table of the elements.

2. Description of the Prior Art

Refractory metals, such as molybdenum, have long been used as direct mount heat sinks for heat generating devices used in electronics. Its high thermal conductivity, on the order of 140 W/M° K, in some cases provide adequate thermal conductivity and a close thermal expansion match (TCE of 5.1 ppm/° C.) to materials like silicon.

Such materials often have poor solderability, which can be improved by applying a thin layer of Ni on to one or both surfaces. Also, layers of Cu are often deposited as a thin layer, such as by cladding, spraying, etc., on to the surface in order to alter the thermal expansion properties to match other devices, such as for example GaAs containing devices (TCE of 6.5 ppm//° C.). Such materials having thin Cu layers (laminates) often have unpredictable expansion characteristics during thermal cycling due to uneven distribution of the material in the surface layer or from layer to layer.

In some instances, metal matrix composites such as powder metal matrices of tungsten or molybdenum infiltrated with copper have provided improved thermal characteristics to meet the requirements of either a closer TCE match or higher thermal conductivity. A powder matrix of this type is limited as to the amounts of higher thermal conductivity materials which can be added without creating thermal expansions that are too high.

Such composite matrix materials are inconsistent in structure and do not perform as predicted by the law of mixtures as the high thermal conductivity copper matrix is often not open enough to conduct heat in an unrestricted fashion (i.e., narrow paths, flow blocked by touching refractory metal particles, etc.). Thus, some of the heat must be transferred through the lower thermally conductive refractory metal matrix. Additionally, low levels of porosity exist in the matrix structure restricting thermal flow.

In many cases laminate or matrix systems of Mo—Cu or W—Cu are made into thin structures by way of standard metallurgical procedures such by sawing, cutting, rolling, grinding, and/or lapping, which induce stresses in the material that cannot be completely relieved. The stresses cause warping of the material at thin gauges when exposed to elevated temperature soldering processes.

Materials commonly used for electronic packaging include Al-Graphite, Cu-Graphite, CuMoCu laminate, CuMoCu laminate with a MoCu powdered metal core, W—Cu metal matrix composites, Mo—Cu metal matrix composites, SILVAR® (available from Engineered Materials Solutions, Inc., Attleboro, Mass.), Al—Si metal matrix composites, Al—SiC metal matrix composites, and Cu—SiC metal matrix composites.

U.S. Pat. No. 4,996,115 discloses a composite structure and a method of producing said composite structure from a combination of copper and a low coefficient of thermal expansion nickel-iron alloy where the copper clads the nickel-iron sheet and is interposed through the central nickel-iron sheet in such a fashion as to provide a substantially isotropic heat transfer path. However, the rolling process used to forge the copper-clad sheet results in non-uniform elongated holes that can result in non-uniform heat transfer and dissipation. Additionally, the large hole size, 40-60 mil, is generally not appropriate for electronic applications.

U.S. Pat. No. 5,011,655 discloses a method of manufacturing a thin metallic body composite structure. An inner layer of a first metal is cleaned to remove oxides and promote metallurgical bonding. The inner layer has a plurality of penetrating holes piercing the thickness of the inner layer. The penetrating holes are filled with metal powder of a second metal. Two outer layers of the second metal are placed on opposite sides of the cleaned and filled inner layer to form a sandwich structure. The sandwich structure is heated to a temperature at which recrystallization will occur in a non-oxidizing atmosphere. The sandwich structure is then hot worked to reduce thickness of the sandwich structure forming the thin metallic body composite structure. Unfortunately, the hot working procedure used to forge the composite structure can result in non-uniform elongated holes that can result in non-uniform heat transfer and dissipation. Additionally, although the composite structure is targeted for use in electronic applications, the large hole size, 40-62 mil, is generally not optimal for such applications. Further, porosity of the powder used to fill the holes detracts from its ability to conduct heat.

U.S. Pat. No. 5,156,923 discloses a metal composite containing layers of copper and Invar, which are cold pressure rolled with reduction in thickness to be metallurgically bonded together in interleaved relation, and strips of the bonded materials are cold pressure rolled together a plurality of times with reduction in thickness to be metallurgically bonded together. The resulting metal composite breaks up the layers of Invar to distribute portions of the Invar material in a copper matrix, which limit thermal expansion of the composite. However, the composite has a limited ability to dissipate heat vertically or in the z-axis direction.

A particular limitation on the use of composite structures is that they are typically porous and cannot be used, for example, in applications where gas or air leakage needs to be prevented, as for example in satellite applications, especially in structures less than 20 mil thick.

U.S. Pat. No. 6,555,762 discloses a high density, electronic package having a conductive composition for filling vias or through holes to make vertical or Z-connects from a dielectric layer to adjacent electrical circuits. The through holes may be plated or non-plated prior to filling.

The above-described matrix materials are also very difficult to obtain in the desired thickness range of less than 20 mils without considerable processing which builds up stress in the refractory metal matrices, which cannot be relieved by thermal processing because of the low melting point of the high thermally conductive infiltrant.

Obtaining a thin material is extremely important because of the thermal relationship:

$$R = \text{Const.} \, L/KA$$

where R is thermal resistance, L is the distance the heat flows or the thickness of the spreader, K is the thermal conductivity of the thermal spreader and A is area. The lower the thermal resistance, the better the performance as a heat sink, which is impacted as follows:

Shorter distance for heat flow and thinner spreaders provide better performance.

Higher thermal conductivity results in lower thermal resistance.

The greater the area that the heat can be spread over, the lower the thermal resistance.

Luedtke, *Thermal Management Materials for High-Performance Applications*, Advanced Engineering Materials, 6, No. 3 (2004), pp. 142-144, discusses copper coated molybdenum and copper coated molybdenum-copper matrix materials as heat spreaders. However, these materials only provide effective thermal conductivities between 190 and 250 W/M° K.

Generally, the prior art discloses materials, such as Ni—Fe alloys with vias designed to improve z-axis thermal conductivity, that approach the properties of refractory metals. However, current needs, especially in the electronics industry, are for materials that surpass the properties of refractory metals. For example, materials with more, but smaller uniform holes that can be filled without stressing the material and are able to dissipate heat in all directions with superior properties to currently available refractory metal systems as well as other systems.

Thus, there is a need in the art for heat sink materials useful with heat generating electronic components that are sufficiently thin and can adequately conduct, remove and dissipate the generated heat in all directions while maintaining dimensional stability.

SUMMARY OF THE INVENTION

The present invention is directed to a substrate for electronic packaging components and integrated circuit components including:
- a core plate containing a Group VIB metal or other high thermally conductive materials from the periodic table of the elements and/or an anisotropic material, having a first major surface and a second major surface and a plurality of openings extending, at least partially, from the first major surface to the second major surface;
- a Group IB metal from the periodic table of the elements or other high thermally conductive material filling at least a portion of the space encompassed by at least some of the openings; and
- optionally, a layer containing a Group IB metal from the periodic table of the elements disposed over at least a portion of the first major surface and at least a portion of the second major surface.

The present invention is also directed to a method of making the above-described substrate for semiconductor and integrated circuit components, the method includes:
- providing a foil or plate comprising a Group VIB metal from the periodic table of the elements or anisotropic material;
- forming a plurality of openings extending, at least partially, from a first major surface to a second major surface of the foil or plate;
- filling the space encompassed by at least some of the openings with a Group IB metal from the periodic table of the elements; and
- optionally forming a layer comprising a Group IB metal from the periodic table of the elements over at least a portion of the first major surface and at least a portion of the second major surface.

The present invention is additionally directed to electronic devices that include the above-described substrate and one or more semiconductor components.

DETAILED DESCRIPTION OF THE INVENTION

Figure 1:
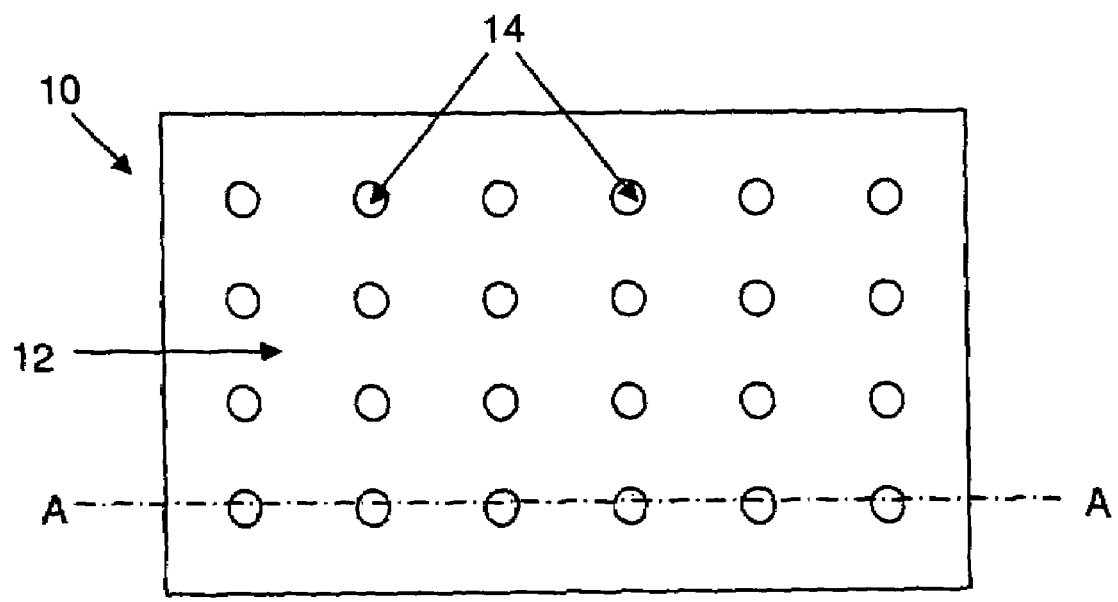
FIG. 1 shows a plan view of a foil or plate with holes according to the invention.

Other than in the operating examples, or where otherwise indicated, all numbers or expressions referring to quantities of ingredients, reaction conditions, etc. used in the specification and claims are to be understood as modified in all instances by the term "about."

As used herein, the phrase "the rule of mixtures" refers to the thermal response a material containing two or more components exhibits. In the rule of mixtures, the thermal properties of a substrate, containing more than one material, in a longitudinal direction (properties parallel, i.e., in an x-y plane) are estimated as the sum of the responses of the composite components weighted by the component volume fractions.

The present invention utilizes etching, stamping, drilling, laser drilling, chemical milling, or combinations thereof to create a repetitive network of precision holes extending at least partially through a refractory metal foil or plate. At least a portion of the holes are at least partially filled with a coating that includes one or more thermally conductive materials. Very thin spreaders of, for example molybdenum and/or tungsten can be created having high thermal conductivity vias without the thermal stress retention drawbacks associated with laminate or matrix compositions as described above. Thus, a new family of materials with significantly lower thermal resistance and higher z-axis thermal conductivities than are available for known refractory metal based heat sinks is provided.

As used herein, "an anisotropic material" refers to materials that exhibit different thermal conductivity values in an x-y plane than along a z-axis perpendicular to the x-y plane. A non-limiting example of an anisotropic material that can be used in the present invention is graphite.

The present invention provides a substrate, that can be used as a heat spreader for semiconductor and integrated circuit components that includes
- a core plate having a first major surface and a second major surface and a plurality of openings extending, at least partially, from the first major surface to the second major surface;
- a metal or other high thermally conductive material filling at least a portion of the space encompassed by at least some of the openings; and
- optionally, a layer containing a metal or other high thermally conductive material disposed over at least a portion of the first major surface and at least a portion of the second major surface.

The core plate includes a Group VIB metal from the periodic table of the elements and/or an anisotropic material. In an embodiment of the invention, the Group VIB metal is selected from molybdenum, tungsten, an alloy containing molybdenum and tungsten, an alloy of molybdenum, an alloy of tungsten, and combinations thereof.

The core plate can have a thickness of at least 1, in some cases at least 2, in other cases at least 3, in some situations at least 4 and in other situations at least 5 mils.

Also, the core plate can have a thickness of to up to 50, in some cases up to 40, in other cases up to 30, in some situations up to 25, in other situations up to 20, in some instances up to 15, and in other instance up to 10 mils. When the core plate is too thick, its thermal resistance may be too high since the heat must travel a greater distance. The core plate can have a thickness represented by any of the values recited above or can have a thickness ranging between any of the values recited above.

In a particular embodiment of the invention, the thickness of the core plate varies form 1 to 10 mils for a first portion of the foil or plate to 5 to 50 mils over a second portion of the foil or plate.

In an embodiment of the invention, the core plate comprises one or more metals and has a thermal conductivity of at least 50, in some cases at least 75 and in other cases at least 100 W/M° K. Also, the core plate can have a thermal conductivity up to 200, in some cases up to 175, and in other cases up to 150 W/M° K. The core plate can have a thermal conductivity represented by any of the values recited above or can have a thermal conductivity ranging between any of the values recited above.

In another embodiment of the invention, the core plate comprises an anisotropic material. The anisotropic material can have a thermal conductivity of at least 50, in some cases at least 75 and in other cases at least 100 W/M° K. Also, the core plate can have a thermal conductivity up to 2,200, in some cases up to 1,750, and in other cases up to 1,500 W/M° K in the x-y plane. The core plate can have a thermal conductivity represented by any of the values recited above or can have a thermal conductivity ranging between any of the values recited above.

The core plate according to the invention has holes or "vias" that extend at least partially through the core plate. The holes can have any suitable shape. Suitable shapes for the holes include, but are not limited to round, square, rectangular, hexagonal, octagonal and combinations thereof. Combination shapes can result, for example, where different techniques for forming holes are used on each surface of the core plate and through holes are formed when the individual holes meet or simply due to acceptable tolerance variations in the manufacture process.

Additionally, the holes can have any suitable cross-sectional shape. Suitable cross-sectional shapes for the holes include, but are not limited to an hour glass-type shape, cone shape, straight sided shape and combinations thereof.

Figure 2:
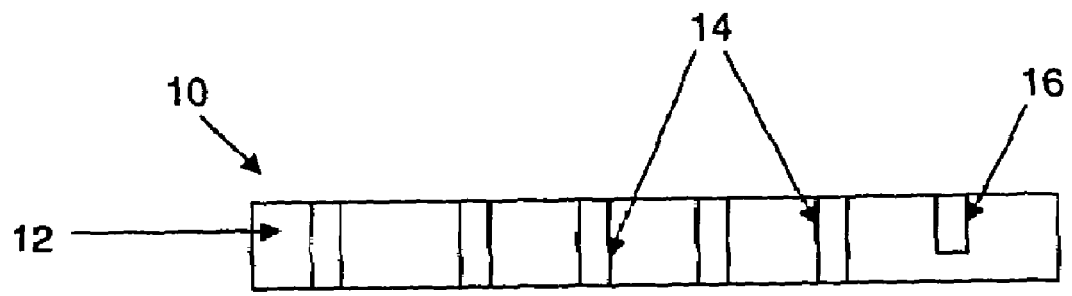
FIG. 2 shows a cross-sectional view of the foil or plate in FIG. 1.

FIGS. 1 and 2 show a particular embodiment of the core plate used in the present invention. Core plate 10 includes the body 12 of core plate 10 and the holes 14 that extend at least partially through body 12. As shown in FIG. 2, holes 14 extend completely through body 12 and hole 16 extends only partially through body 12.

In an embodiment of the invention, the openings in the core plate can make up at least 5, in some cases at least 10, in other cases at least 15, in some situations at least 20, and in other situations at least 25 percent of the volume of the core plate. Also, the openings in the core plate can provide up to 90, in some cases up to 75, in other cases up to 60, in some situations up to 50, and in other situations up to 40 percent of the volume of the core plate.

The diameter and shape of the holes can vary according to generally accepted manufacturing tolerances in the art. Typically, in the present invention the holes are smaller and more numerous than those in the prior art which leads to improved heat dissipation in the vertical or z-axis direction and, which is also more compatible with electronic and computer related applications. Generally, the present substrates provide performance that exceeds that found using refractory metals, such as tungsten or molybdenum alone.

In an embodiment of the invention, the holes or openings can be at least 2 mil some cases at least 3 mil and in other cases at least 5 mil in diameter measured at the widest point. Also, the holes can be up to 25 mil, in some cases up to 20 mil, and in other cases up to 15 mil in diameter. The size of the holes depends on the area and thickness of the core plate as well as the particular thermal conductivity properties desired in the final product. The diameter of the holes can be any value or range between any of the values recited above.

In an embodiment of the invention, the ratio of the diameter of the holes or openings to the thickness of the core plate or foil can be at least 0.75, in some cases at least 0.8, in other cases at least 0.9 and in some instances at least 1, where the opening is measured at the widest point. Also, the ratio of the diameter of the holes or openings to the thickness of the core plate or foil can be up to 1.5, in some cases up to 1.4, in other cases up to 1.3, in some instances up to 1.25 and in other instances up to 1.2. The ratio of the diameter of the holes or openings to the thickness of the core plate or foil can be any value or range between any of the values recited above.

The layer in the present substrate is disposed over at least a portion of the first major surface and at least a portion of the second major surface of the core plate and can contain a Group IB metal from the periodic table of the elements. The layer material also at least partially fills the space encompassed by at least some of the holes or openings in the core plate.

Any suitable Group IB metal can be used in the layer. Suitable Group IB metals include, but are not limited to copper, an alloy of copper, silver, or an alloy of silver.

The layer can also include a high thermally conductive material. Such materials typically have a thermal conductivity of at least 200 W/M° K. Suitable high thermally conductive materials include, but are not limited to diamond, alloys, composite materials, and nanotubes.

As used herein the term "alloys" that are a high thermally conductive material refer to compositions containing one or more metals that have a thermal conductivity of at least 200 W/M° K.

As used herein the term "composite materials" refers to compositions that contain a Group IB metal and at least one other material.

As used herein, the term "nanotubes" refers to systems that consist of graphitic layers seamlessly wrapped to cylinders. The cylinders are typically only a few nanometers in diameter and can be up to a millimeter or more in length. The length-to-width aspect ratio is extremely high.

In a particular embodiment of the invention, the layer can include at least 0.001, in some cases at least 0.01, and in other cases at least 0.1 percent by weight Ni and up to 1, in some cases 0.75 and in other cases up to 0.5 percent by weight of the layer of Ni. In an embodiment of the invention, the Ni can be applied as a thin layer over the surface of the plate or foil. The inclusion of Ni can allow the Group IB metal layer to better wet the surface of the core plate and fill the holes as desired.

In an embodiment of the invention, the Group IB metal or other high thermally conductive material layer contains one or more materials having a thermal conductivity of at least 200, in some cases at least 350 and in other cases at least 500 and up to 2,200, in other instance up to 1,500, in some instances up to 1,200, in some cases up to 1,100 and in other cases up to 1,000 W/M° K. The thermal conductivity of the particular materials in the layer can be any of the values or range between any of the values recited above.

In an embodiment of the invention, at least some of the holes or openings in the core plate or foil are at least partially filled with one or more Group IB metals or other high thermally conductive material and no layer is disposed on any surface of the core plate or foil.

In another embodiment of the invention the holes or openings in the core plate or foil are at least partially filled with one or more Group IB metals or other high thermally conductive materials and a layer is disposed over at least a portion of a surface of the core plate or foil. When a layer is present (i.e., there can be a layer thickness of zero), the layer, on each surface of the core plate, can have a thickness of at least 0.001, in some cases at least 0.01, in other cases at least 0.1, in some situations at least 1, in other situations at least 2, in some instances at least 3 and in other instances at least 5 mils. When the layer is too thin, its heat spreading capability will be diminished. Also, the layer can have a thickness of to up to 50, in some cases up to 40, in other cases up to 30, in some situations up to 25, in other situations up to 20, in some instances up to 15, and in other instance up to 10 mils. The layer can have a thickness represented by any of the values recited above or can have a thickness ranging between any of the values recited above.

In an embodiment of the invention, the layer of a Group IB metal is uniform from one side of the substrate to the other, uniform meaning that the thickness of the layer does not vary more than ±10%, in some cases no more than ±5%, from one side of the substrate to the other.

In a particular embodiment of the invention, the layer is not uniform across the surfaces of the core plate. In a particular embodiment, the thickness of the layer varies from zero or 0.001 to 10 mils over a first portion of the core plate to 5 to 50 mils over a second portion of the core plate.

When a layer is present, any suitable ratio of the core plate thickness to the thickness of each layer can be used in the present substrate. In an embodiment of the invention, the ratio of the thickness of the core plate to the thickness of the layer over the first major surface can be from 1:0.1 to 1:2, in some cases from 1:0.5 to 1:1.5, in other cases 1:0.75 to 1:1.25 and in particular instances approximately 1:1. Additionally, the layer over the second major surface can be from 1:0.1 to 1:2, in some cases from 1:0.5 to 1:1.5, in other cases 1:0.75 to 1:1.25 and in particular instances approximately 1:1.

The layer has a thermal conductivity of at least 200, in some cases at least 250 and in other cases at least 300 W/M° K. Also, the layer can have a thermal conductivity up to 500, in some cases up to 400, and in other cases up to 350 W/M° K.

The layer can have a thermal conductivity represented by any of the values recited above or can have a thermal conductivity ranging between any of the values recited above.

In an embodiment of the invention, the present substrate does not exhibit thermal properties as would be expected or predicted based on the rule of mixtures. In a particular embodiment, the TCE is lower than expected or predicted. The predicted TCE of the present substrate can be at least 10% less, in some cases at least 20% less and in other cases at least 25% lower than predicted by the rule of mixtures.

Figure 3:
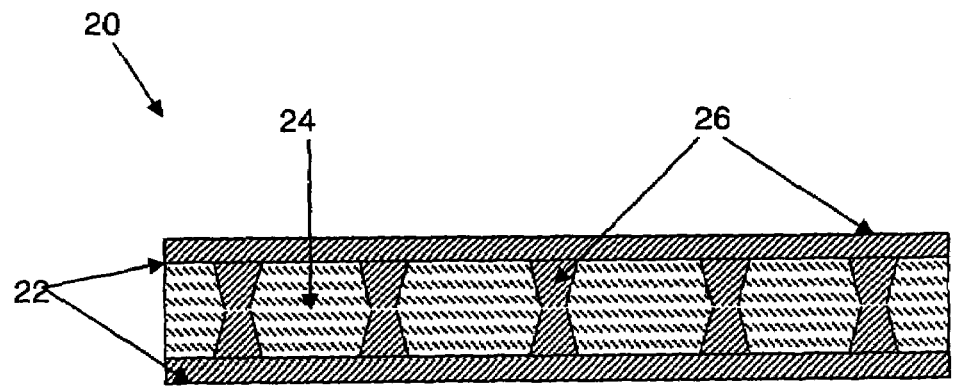
FIG. 3 shows a cross-sectional view of one example of a foil or plate with holes according to the invention where the surfaces have been coated and the holes filled with a metal.

A particular embodiment of the invention is shown in FIG. 3. In this embodiment, substrate 20 includes core plate or foil 24 with roughly hour glass shaped holes 26 extending there through. Core plate 24 contains one or more refractory Group VIB metals. Layer 22 is disposed over the surfaces of core plate 24 and fills holes 24. Layer 26 contains copper, an alloy of copper, silver, or an alloy of silver.

In an embodiment of the invention, the substrate can have a thermal conductivity of at least 50, in some cases at least 100, in other cases at least 150, in some instances at least 200, in other instances at least 250, in some situations at least 275 and in other situations at least 300 W/M° K. The substrate can have a thermal conductivity represented by any of the values recited above or can have a thermal conductivity ranging between any of the values recited above.

In an embodiment of the invention, the substrate has a thickness of at least 1 mil, in some cases at least 2.5 mil and in other cases at least 5 mil. Also, the substrate can have a thickness of up to 100 mil, in some cases up to 50 mil, in other cases up to 35 mil, and in some instances up to 25 mil. The substrate thickness can be any value or range between any of the values recited above.

In particular embodiments of the invention, specific combinations of Group VIB metals in the core plate and Group IB metals in the layer can be used. As a particular example, the Group VIB metal can be molybdenum and the Group IB metal can be copper. In another particular example, the Group VIB metal can be tungsten and the Group IB metal can be copper.

Typically, the Group VIB metal foil with holes at least partially filled with a Group IB metal and optionally coated with a Group IB metal is a hermetic structure. As used herein, "hermetic structure" means that the filled matrix of the invention is airtight, meaning that gasses cannot readily pass through the structure. As a non-limiting example, the inventive matrix is hermetic in that it has a leak rate of less than $1 \times 10^{-3}$ std cc/sec at 1 atmosphere differential. As another non-limiting example, the inventive matrix is hermetic in that it meets the leak rate specifications required for satellite applications.

In an embodiment of the invention, two or more layers of substrates can be "stacked" to provide a sandwich-type structure. In this embodiment, two or more core plates containing a Group VIB metal and/or an anisotropic material having a plurality of openings extending, at least partially, from a first major surface to a second major surface with the holes filled and surfaces coated with a layer of a Group IB metal, as described above, are placed one on top of another.

Figure 4:
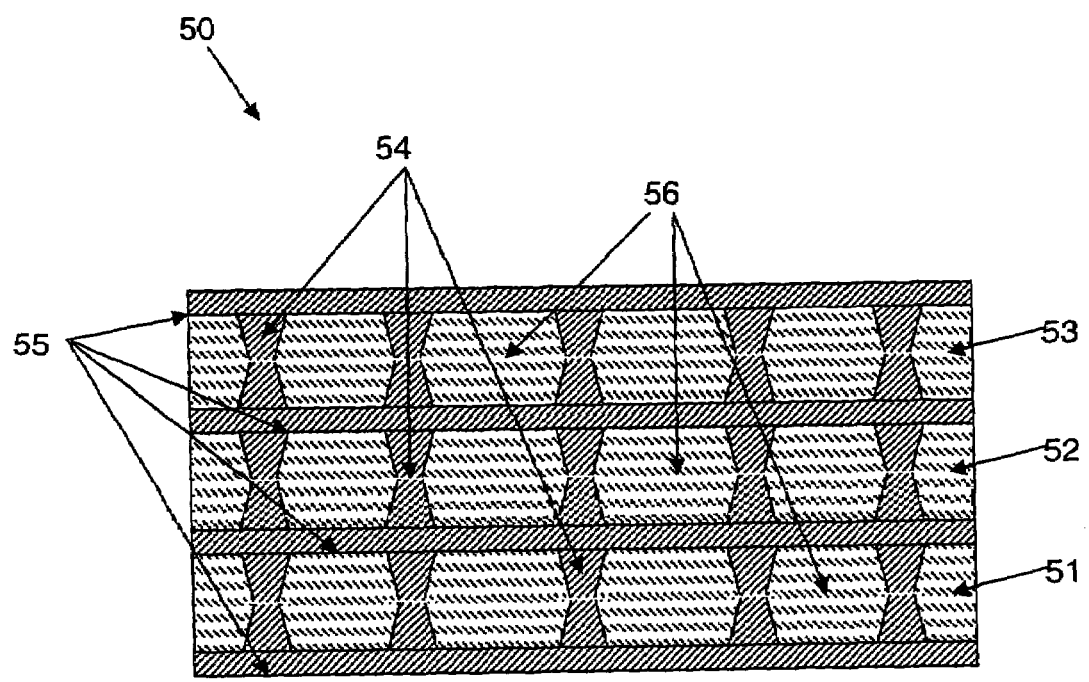
FIG. 4 shows a cross-section view of a sandwich substrate according to the invention.

A non-limiting example of a stacked substrate is shown in FIG. 4. Stacked substrate 50 includes first substrate layer 51, second substrate layer 52, and third substrate layer 53. Each of substrate layers 51, 52, and 53 include layers of a Group IB metal 55 disposed over the upper and lower surfaces of core plates 56, which contain a Group VIB metal and/or an anisotropic material, and holes 54 extending through substrate layers 51, 52, and 53, which are filled with a Group IB metal. Although holes 54 are shown in alignment one above the other, such an alignment is optional, as the holes can be offset, which can be desirable in some instances to aid in heat dissipation.

In the sandwich substrate of the present invention, heat can be transferred vertically (in a z-axis direction) between layers via the Group IB metal filling holes 54. At each layer, heat is transferred laterally, or in an x-y plane along Group IB metal layers 55. Thus, such a structure effectively transfers heat in all directions.

In the sandwich substrate of the present invention can provide thicker substrates than single layer substrates as adequate lateral (x-y plane) heat dissipation can be provided. Thus, the sandwich substrate of the present invention can have a thickness of at least 2 mil, in some cases at least 5 mil and in other cases at least 10 mil. Also, the sandwich substrate can have a thickness of up to 1,000 mil, in some cases up to 500 mil, in other cases up to 250 mil, in some instances up to 200 mil, and in other instances up to 100 mil. The sandwich substrate thickness can be any value or range between any of the values recited above.

In a particular embodiment of the invention, the sandwich substrate of the present invention can have a thickness of from about 2 to about 40 mil.

The sandwich structure of thin sheets according to the present invention can be particularly advantageous as more numerous, more uniform, smaller holes can be provided across the top and bottom surfaces of the substrate when compared to prior art methods or when thicker sheets are utilized to form the substrate. As hole diameter is related to substrate thickness, making and filling very small holes in a very thin substrate and then stacking the very thin substrates as described above provides a substrate surface with more numerous, more uniform, and smaller holes, and thus with an improved heat transfer capability.

In an embodiment of the invention, the stacked or sandwich structured substrate has holes along one or both surfaces such that the ratio of the diameter of the hole openings to the thickness of the stacked substrate is less than 0.75.

As indicated above, prior art laminate or matrix systems of Mo—Cu or W—Cu are made into thin substrates by way of standard metallurgical procedures, which induce stresses in the material that cannot be completely relieved. The stresses cause warping of the material at thin gauges when exposed to elevated temperature soldering processes. A particular advantage of the present substrate for electronic packaging components and integrated circuit components is that stresses in the core plate can be relieved prior to adding the Group IB metal. This prevents warping at thin gauges as is found in the prior art materials.

The present invention also provides a method of making the above-described substrate for semiconductor and integrated circuit components. The method includes:

providing a foil or plate or plate containing a Group VIB metal from the periodic table of the elements and/or an anisotropic material;

forming a plurality of openings extending, at least partially, from a first major surface to a second major surface of the foil or plate;

forming a layer containing a Group IB metal from the periodic table of the elements over at least a portion of the first major surface and at least a portion of the second major surface; and at least partially filling the space encompassed by at least some of the openings with the Group IB metal.

The present method is advantageous in that it utilizes easy to handle core plate or foil materials that are worked or modified using standard processing methods to which a Group IB metal is subsequently added. This is an advantage over prior art heat sink materials which require much more complicated and expensive processing steps.

In an embodiment of the invention, the openings are formed in the foil or plate by a method selected from etching, stamping, drilling, laser drilling, chemical milling, and combinations thereof.

In another embodiment of the invention, the layer is formed using one or methods selected from melting, thermal spray, powder melt, electroplating, melt and electroplate, sputtering, selective plating, infiltration, casting, pressure casting, and combinations thereof.

In an embodiment of the invention, all stress inducing process steps (for example, sawing, cutting, rolling, grinding, and/or lapping) are completed prior to adding the Group IB metal to the foil or plate.

In an embodiment of the invention, strips of the Group IB metal are placed over a surface of the foil or plate and the strips are heated to a temperature at which the strips melt and fill the holes or openings and optionally form a layer. In a particular embodiment, two or more layers of strips are placed over a surface of the foil or plate and melted. In the latter situation, improved heat distribution during melting and improved hole fill results. Not wishing to be bound to any particular theory, it is believed that the capillarity that results between unmelted upper strips and melted lower strips results in improved flow, distribution and fill of the Group IB metal. This method allows for preparing larger coated sections of the plate or foil due to the improved spreading characteristic of the Group IB metal.

In an embodiment of the invention, a final reduction step can be used in the method of making the above-described substrate for semiconductor and integrated circuit components. The reduction step can be carried out in order to make the surface more uniform, densify the substrate, reduce the thickness of the substrate and/or to temper the substrate. Any suitable reduction step can be employed, suitable reduction steps include, but are not limited to rolling and hot isostatic pressing.

The present invention also provides a substrate made according to the above-described method.

The present invention also provides electronic packaging components that include the substrate described above and one or more semiconductor components.

Any suitable electronic packaging component can be included in the invention, especially those that include heat generating components. Suitable electronic packaging components include, but are not limited to wireless communications devices, fiber optic lasers, power generating semiconductors, resistors, and opto-electronic devices.

In an embodiment of the invention, the above-described substrate or stacked substrate can be attached to a second substrate of greater or lesser thermal expansion properties to form a combination substrate. Non-limiting examples of such second substrates include, but are not limited to steel, aluminum, copper, or ceramic substrates. The combination substrates are advantageous as they have improved heat distribution properties and the internal stresses are reduced.

As a non-limiting example, the combination substrate described above can be used as a backing plate for sputtering targets.

The present invention will further be described by reference to the following examples. The following examples are merely illustrative of the invention and are not intended to be limiting. Unless otherwise indicated, all percentages are by weight.

EXAMPLES

The molybdenum used typically had a thermal conductivity (TC) of 140 W/m° K and coefficient of thermal expansion (CTE) of about 5.1 PPM/° C. from 26° C. to 400° C. in a nitrogen atmosphere.

Cold worked pure molybdenum foils were rolled to 0.005" (0.0127 cm, the 5 mil foil) and 0.010" (0.0254 cm, the 10 mil foil) thicknesses. A photo chemical mask was applied on both sides of each foil and a staggered hole pattern with a hole volume of 28% was created by a photo chemical milling techniques from both sides for better hole tolerance control. The typical diameter size was approximately 1.2 times the foil thickness for both the 5 and 10 mil materials. Since the holes were larger on the 10 mil strip there were fewer holes per unit area than on the 5 mil strip.

The milled molybdenum had a CTE of 5.65 ppm from 27° C. to 400° C.

Samples were placed on graphite boats with strips of 0.028" oxygen free high conductivity (OFHC) copper foil and passed through a conveyor furnace at 3 inches/minute at 2000° F. (1093° C.) in a hydrogen atmosphere at a dew point of −80° C.

The 5 mil foil wet easily but the 0.010" Mo foil was not uniformly wet. This was attributed to the longer time needed to etch through 10 mils of Mo and the subsequent rougher surface.

The 10 mil foil was placed on the same graphite boats with no Cu foil and passed trough the same furnace at 3"/minute to reduce and clean the strip surface. The same strip was again placed on a graphite boat under the same conditions as indicated above with Cu foil. The uniformity of the wetting was now equivalent to the 5 mil strip.

Single Layer Foil 5 mil Foil

A 5 mil Mo foil was run through a furnace with 1 piece of a 2.8 mil Cu foil which covered the entire surface. This foil thickness was roughly equivalent to the 40% hole volume with additional material to cover the Mo surface. Some areas of the surface had areas where the Cu was not uniformly wet and Cu built up approximately 1 mil on the top surface. Some samples displayed this condition while others were wet uniformly. In all cases the molten Cu did not completely fill the holes and electroplating was needed to completely fill any depressions and create a smooth Cu overlayer. The variation was attributed to fixturing and capillarity.

Samples were cut into approximately ⅝" squares and were plated with electrolytic copper until the samples were completely smooth. The 5 mil foil had a 4.5 mil copper overcoat on each side with a total thickness of 14 mil and a TC of 232-236 W/m° K.

10 mil Foil

A 10 mil Mo foil was run through the furnace with 2 pieces of 2.8 mil Cu foil which covered the entire surface. This foil thickness was roughly equivalent to the 40% hole volume with additional material to cover the Mo surface. Some areas of the surface had areas where the Cu was not uniformly wet and built up approximately 1 mil on the top surface. Some samples displayed this condition while others were wet uniformly. In all cases the molten Cu did not completely fill the holes and electroplating was needed to completely fill any depressions and create a smooth Cu overlayer. The variation was attributed to fixturing and capillarity.

Samples were cut into approximately ⅝" squares and had a total thickness of 12 mil and a CTE of about 6.36 ppm from 26° C. to 400° C. in a nitrogen atmosphere.

This result demonstrates that the substrates of the present invention do not follow the rule of mixtures. This sample has a predicted CTE of 10.9 ppm [5.1 (CTE of Mo)×0.51 (volume fraction of Mo)+17 (CTE of Cu)×0.49 (volume fraction of Cu)=10.9 ppm], but a measured CTE of 6.3 ppm.

5 mil Foil Ni Plated 5 mil foils were plated with 2 mil of Ni and diffusion baked at 1800° F. (982° C.) to promote adhesion and processed with molten Cu to improve Cu wettability.

The 5 mil Mo foil was run through the furnace with 1 piece of 2.8 mil Cu foil which covered the entire surface. This foil thickness was roughly equivalent to the 40% hole volume with additional material available to cover the Mo surface. The molten Cu completely filled the holes and electroplating was needed to completely fill any depressions and create a smooth Cu overlayer. The Ni improved the wetting of the molybdenum surface.

10 mil Foil Ni Plated 10 mil foils were plated with 2 microinches of Ni and diffusion baked at 1800° F. (982° C.) to determine if the Ni coating improved Cu wettability.

The 10 mil Mo foil was run through the furnace with 2 pieces of 2.8 mil foil which covered the entire surface. This foil thickness was roughly equivalent to the 40% hole volume with additional material available to cover the Mo surface. The molten Cu completely filled the holes and electroplating was needed to completely fill any depressions and create a smooth Cu overlayer. The Ni improved the wetting of the molybdenum surface but the wetting was not as good as in the 5 mil foil experiment. This was attributed to better capillarity because of the smaller diameter holes.

Samples were cut into approximately ⅝" squares and had a thickness of 10 mil and TC of 190 W/m° K.

The samples were next plated with electrolytic copper until the samples were completely smooth. The copper overcoat was 5 mil thick and the overall thickness of 20 mil. The samples had a thermal conductivity of from 185-219 W/m° K depending on the measuring time (1.3-28.8 msec).

Two or More Foil Layers 5 mil Foils

Two 5 mil thick pieces of molybdenum perforated foil were placed on the graphite boats with a 2.8 mil Cu foil in between them and another on the top. The samples were processed in the same manner. The wetability of the Mo surface was superior and the molten Cu moved very uniformly out to the edges of the strip. No non uniform buildup of Cu on the surface was experienced. It appears that the gap between the strip surfaces had provided a capillary path which moved the Cu more uniformly than in the case of the single strip experiments. The use of a thin Ni surface layer was not needed for good wetability. This is beneficial because the Ni can influence the TC of the Mo—Cu matrix.

Samples were cut into approximately ⅝" squares and had a thickness of 12 mil and TC of 219 W/m° K.

5 mil Foils

Figure 5:
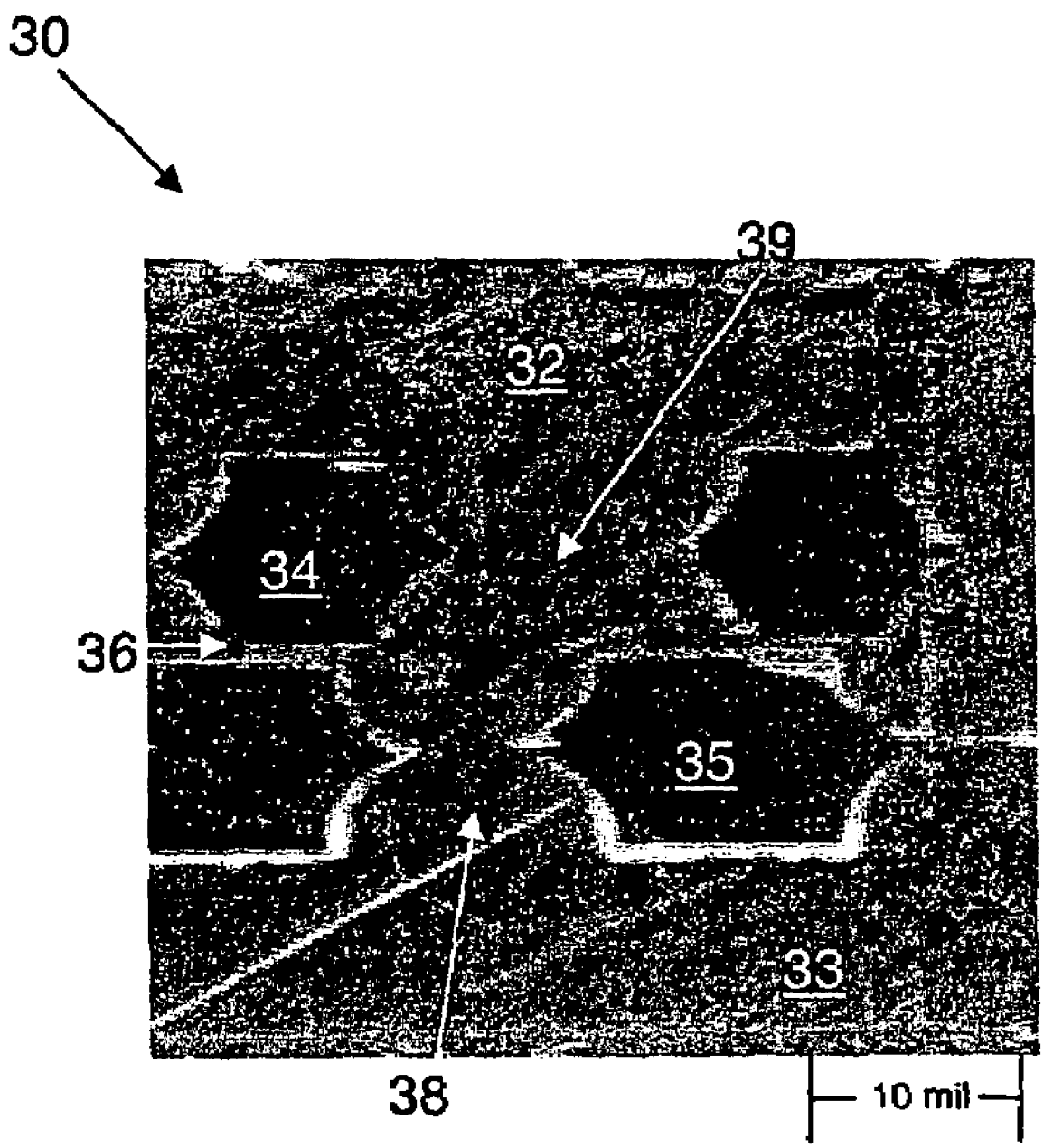
FIG. 5 shows a 30× photograph of a cross-sectioned two layer perforated molybdenum substrate that has been copper filled and coated according to the invention.

Two 5 mil thick pieces of molybdenum perforated foil were placed on the graphite boats with a 1 mil Cu foil between them and 5 mil Cu foil along the top and bottom surfaces. The samples were processed in the same manner. The resulting substrate was cross-sectioned and photographed at 30× as shown in FIG. 5. The photograph of substrate 30 shows top molybdenum piece 34, bottom molybdenum piece 35, with a thin layer of copper 36 between top piece 34 and bottom piece 35. Top copper layer 32 and bottom copper layer 33 are connected via bottom copper filled hole 38 and top copper filled hole 39.

10 mil Foils

Two 10 mil thick pieces of Mo perforated foil were placed on the graphite boats with a 2.8 mil Cu foil in between them and another on the top. In this case the Mo strip was not passed through the furnace in a hydrogen atmosphere to clean the surface. The samples were processed in the same manner. The wetability of the Mo surface was superior and the molten Cu moved very uniformly out to the edges of the strip. No non uniform buildup of Cu on the surface was experienced but the remaining indentations were deeper than with the two 5 mil foils because of the reduced amount of available Cu. It appears that the gap between the strip surfaces again provided a capillary path which moved the Cu more uniformly than in the case of the single strip experiments. Thus, the use of a thin Ni surface layer was not needed. This is beneficial since the Ni can influence the TC of the Mo—Cu matrix. The experienced degree of improvement with the 10 mil foil over a single 10 mil foil was superior to that experienced with the 5 mil single and multiple foil equivalents.

Samples were cut into approximately ⅝" squares and had a thickness of 22 mil and TC of 273 W/m° K.

The samples were next plated with electrolytic copper until the samples were completely smooth. The samples had a thickness of 21 mil and CTE of 8.13 ppm from 26° C. to 400° C. in a nitrogen atmosphere.

The data demonstrate that the substrates according to the present invention provide significantly enhanced thermal conductivity with only a minimal increase in the coefficient of thermal expansion compared with using only a molybdenum substrate.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. A substrate for electronic packaging components and integrated circuit components comprising: a core plate containing a Group VIB metal from the periodic table of the elements and/or an anisotropic material, having a first major surface and a second major surface and a plurality of openings extending, at least partially, from the first major surface to the second major surface; a Group IB metal from the periodic table of the elements or other high thermally conductive material filling at least a portion of the space encompassed by at least some of the openings; and optionally, a layer containing a Group IB metal from the periodic table of the elements or other high thermally conductive material disposed over at least a portion of the first major surface and at least a portion of the second major surface and wherein the ratio of the diameter of the openings to the thickness of the plate is from 0.75 to 1.5 and the diameter of the openings are up to 25 mils.

2. The substrate according to claim 1, wherein the Group VIB metal is selected from the group consisting of molybdenum, tungsten, an alloy containing molybdenum and tungsten, an alloy of molybdenum, an alloy of tungsten, and combinations thereof.

3. The substrate according to claim 1, wherein the Group IB metal in the space encompassed by at least some of the openings and said optional layer is copper, an alloy of copper, silver, or an alloy of silver.

4. The substrate according to claim 1, wherein the other high thermally conductive material is selected from the group consisting of diamond, alloys, composite materials, and nanotubes.

5. The substrate according to claim 1, wherein the layer contains one or more materials having a thermal conductivity of from 200 to 2,200 W/M° K.

6. The substrate according to claim 1, wherein the openings are from 1 to 25 mils at their largest dimension.

7. The substrate according to claim 1, wherein the ratio of the thickness of the core plate to the thickness of the layer over the first major surface is from 1:0.1 to 1:2 and the layer over the second major surface is from 1:0.1 to 1:2.

8. The substrate according to claim 1 having a thermal conductivity of at least 50 W/M° K.

9. The substrate according to claim 1, wherein the Group VIB metal is molybdenum and the Group IB metal in the space encompassed by at least some of the openings and said optional layer is copper.

10. The substrate according to claim 1, wherein the Group VIB metal is tungsten and the Group IB metal in the space encompassed by at least some of the openings and said optional layer is copper.

11. The substrate according to claim 1, wherein the core plate is metal and has a thermal conductivity of from 50 to 200 W/M° K.

12. The substrate according to claim 1, wherein the core plate comprises an anisotropic material and has a thermal conductivity of from 50 to 2,200 W/M° K.

13. The substrate according to claim 1, wherein the layer has a thermal conductivity of from 200 to 500 W/M° K.

14. The substrate according to claim 1, wherein the openings in the core plate have a shape selected from round, square, rectangular, hexagonal, octagonal, and combinations thereof.

15. The substrate according to claim 1, wherein the openings in the core plate have a cross sectional shape selected from the group consisting of an hour glass-type shape, cone shape, straight sided shape and combinations thereof.

16. The substrate according to claim 1, wherein the openings in the core plate comprise from 5 to 90 percent of the volume of the core plate.

17. The substrate according to claim 1, wherein the thermal coefficient of expansion (TCE) of the substrate is less than the TCE predicted by the rule of mixtures.

18. An electronic packaging component comprising the substrate according to claim 1 and one or more semiconductor components.

19. The electronic packaging component according to claim 18, wherein the electronic packaging component is selected from the group consisting of wireless communications devices, fiber optic lasers, power generating semiconductors, resistors, and opto-electronic devices.

20. The substrate for electronic packaging components and integrated circuit components according to claim 1, wherein the substrate is a hermetic structure.

21. A stacked substrate comprising two or more substrates according to claim 1 placed one on top of the other.

22. The stacked substrate according to claim 21 having a thickness of from 2 mil to 1,000 mil.

23. The stacked substrate according to claim 21, wherein the Group VIB metal is selected from the group consisting of molybdenum, tungsten, an alloy containing molybdenum and tungsten, an alloy of molybdenum, an alloy of tungsten, and combinations thereof.

24. The stacked substrate according to claim 21, wherein the Group IB metal is copper, an alloy of copper, silver, or an alloy of silver.

25. The stacked substrate according to claim 21 having a capillary path between a first substrate layer and a second substrate layer.

26. A combination substrate comprising the stacked substrate according to claim 21 attached to a second substrate.

27. The combination substrate according to claim 26, wherein the second substrates is selected from the group consisting of steel, aluminum, copper, ceramic substrates and combinations thereof.

28. A backing plate for a sputtering target comprising the combination substrate according to claim 26.

29. A combination substrate comprising the substrate according to claim 1 attached to a second substrate.

30. The combination substrate according to claim 29, wherein the second substrates is selected from the group consisting of steel, aluminum, copper, ceramic substrates and combinations thereof.

31. A backing plate for a sputtering target comprising the combination substrate according to claim 29.

32. The substrate according to claim 1, wherein the ratio of the diameter of the openings to the thickness of the plate is from 0.8 to 1.4.

33. The substrate according to claim 1, wherein the ratio of the diameter of the openings to the thickness of the plate is from 0.9 to 1.3.

* * * * *